(12) United States Patent
Chen et al.

(10) Patent No.: US 8,188,593 B2
(45) Date of Patent: May 29, 2012

(54) SILICON SUBSTRATE HAVING THROUGH VIAS AND PACKAGE HAVING THE SAME

(75) Inventors: Kuo-Hua Chen, Kaohsiung (TW); Kuo-Pin Yang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 224 days.

(21) Appl. No.: 12/691,478

(22) Filed: Jan. 21, 2010

(65) Prior Publication Data

US 2010/0187681 A1 Jul. 29, 2010

(30) Foreign Application Priority Data

Jan. 23, 2009 (TW) .............................. 98103034 A

(51) Int. Cl.
*H01L 23/34* (2006.01)
*H01L 23/48* (2006.01)

(52) U.S. Cl. ............ 257/712; 257/E23.011; 257/E23.08; 257/773; 257/686; 257/774; 257/777; 257/723; 257/720; 257/717; 257/778; 257/698; 257/621

(58) Field of Classification Search .................. 257/712, 257/773, 774, E23.011, E23.08, 621, 698, 257/778, 723, 717, 720, 676, 777, 686
See application file for complete search history.

(56) References Cited

U.S. PATENT DOCUMENTS

| | | | | |
|---|---|---|---|---|
| 7,276,787 B2* | 10/2007 | Edelstein et al. | ............ | 257/774 |
| 7,656,023 B2* | 2/2010 | Sunohara et al. | ............ | 257/704 |
| 7,821,107 B2* | 10/2010 | Pratt | ............ | 257/621 |
| 7,906,431 B2* | 3/2011 | Mistuhashi | ............ | 438/675 |
| 2009/0196001 A1* | 8/2009 | Sunohara et al. | ............ | 361/781 |
| 2010/0032811 A1* | 2/2010 | Ding et al. | ............ | 257/621 |
| 2010/0237378 A1* | 9/2010 | Lin et al. | ............ | 257/99 |
| 2010/0244223 A1* | 9/2010 | Cho et al. | ............ | 257/690 |
| 2011/0062591 A1* | 3/2011 | Choi et al. | ............ | 257/773 |
| 2011/0068433 A1* | 3/2011 | Kim et al. | ............ | 257/531 |
| 2011/0068453 A1* | 3/2011 | Cho et al. | ............ | 257/686 |
| 2011/0104828 A1* | 5/2011 | Balucani | ............ | 438/3 |
| 2011/0217812 A1* | 9/2011 | Hedler et al. | ............ | 438/108 |

* cited by examiner

*Primary Examiner* — A O Williams
(74) *Attorney, Agent, or Firm* — McCracken & Frank LLC

(57) ABSTRACT

The present invention relates to a silicon substrate having through vias and a package having the same. The silicon substrate includes a substrate body, a plurality of through vias and at least one heat dissipating area. The substrate body has a surface, and the material of the substrate body is silicon. The through vias penetrate the substrate body, and each of the through vias has a conductive material therein. The heat dissipating area is disposed on the surface of the substrate body and covers at least two through vias. The heat dissipating area is made of metal, and the through vias inside the heat dissipating area have same electrical potential. Thus, the heat in the through vias is transmitted to the heat dissipating area, and since the area of the heat dissipating area is large, the silicon substrate has good heat dissipation efficiency.

18 Claims, 8 Drawing Sheets

SILICON SUBSTRATE HAVING THROUGH VIAS AND PACKAGE HAVING THE SAME

BACKGROUND OF THE INVENTION

1. Field of the Invention

The present invention relates to a silicon substrate and a package having the same, and more particularly to a silicon substrate having through vias and a package having the same.

2. Description of the Related Art

FIG. 1 shows a top view of a conventional substrate having through vias. The substrate 1 comprises a substrate body 11 and a plurality of through vias 12. The substrate body 11 has a surface 111. The through vias 12 penetrate the substrate body 11, and each of the through vias 12 has a conductive material 121 therein. The through vias 12 are filled with the conductive material 121.

The disadvantage of the conventional substrate having through vias 1 is as follows. The material of the conductive material 121 of the through vias 12 of the substrate 1 is usually metal, because metal is good heat conductor. However, as the through vias 12 are filled with the conductive material 121, only little of the conductive material 121 is exposed to the surface 111 of the substrate 1, so the substrate 1 has poor heat dissipation efficiency.

Therefore, it is necessary to provide a silicon substrate having through vias and a package having the same to solve the above problems.

SUMMARY OF THE INVENTION

The present invention is directed to a silicon substrate having through vias. The silicon substrate comprises a substrate body, a plurality of through vias and at least one heat dissipating area. The substrate body has a surface, and the material of the substrate body is silicon. The through vias penetrate the substrate body, and each of the through vias has a conductive material therein. The heat dissipating area is disposed on the surface of the substrate body and covers at least two through vias. The heat dissipating area is made of metal, and the through vias inside the heat dissipating area have same electrical potential.

The present invention is further directed to a package having silicon substrate with through vias. The package comprises a first substrate, a second substrate, at least one second chip and a plurality of connecting elements. The second substrate is disposed on the first substrate, wherein the second substrate is a silicon substrate, and the second substrate comprises a second substrate body, a plurality of second through vias and at least one second heat dissipating area. The second substrate body has a surface. The second through vias penetrate the second substrate body, and each of the second through vias has a second conductive material therein. The second heat dissipating area is disposed on the surface of the second substrate body and covers at least two second through vias. The second heat dissipating area is made of metal, and the second through vias inside the second heat dissipating area have same electrical potential. The second chip is disposed on the second substrate and electrically connected to the second substrate. The connecting elements electrically connect the second through vias of the second substrate to the first substrate.

In this way, the heat in the through vias is transmitted to the heat dissipating area, and since the area of the heat dissipating area is large, the silicon substrate has good heat dissipation efficiency. Moreover, as the through vias inside the heat dissipating area have same electrical potential, the noise is isolated and signal interference can be avoided.

DETAILED DESCRIPTION OF THE INVENTION

Figure 1:
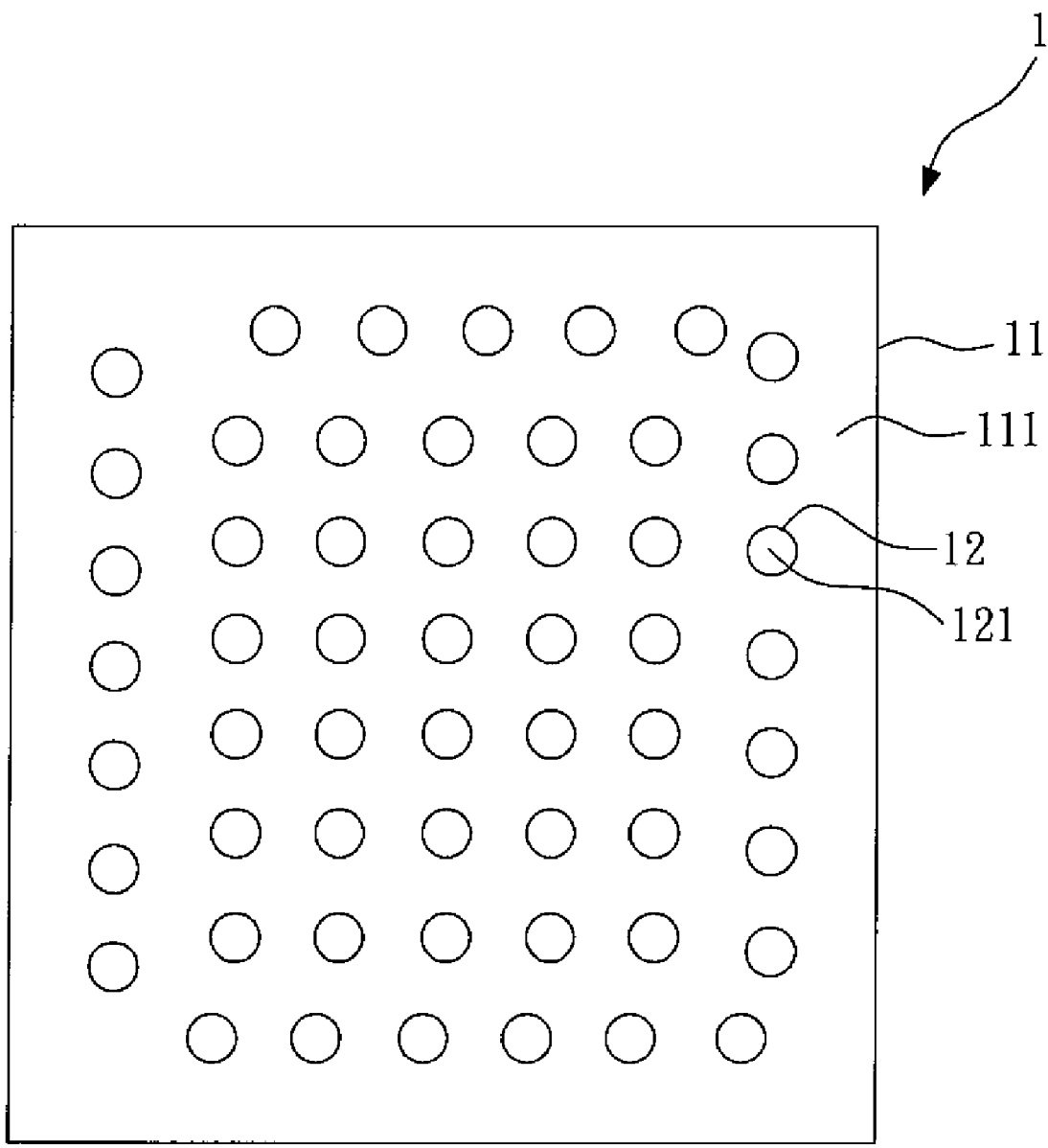
FIG. 1 is a top view of a conventional substrate having through vias.
Figure 2:
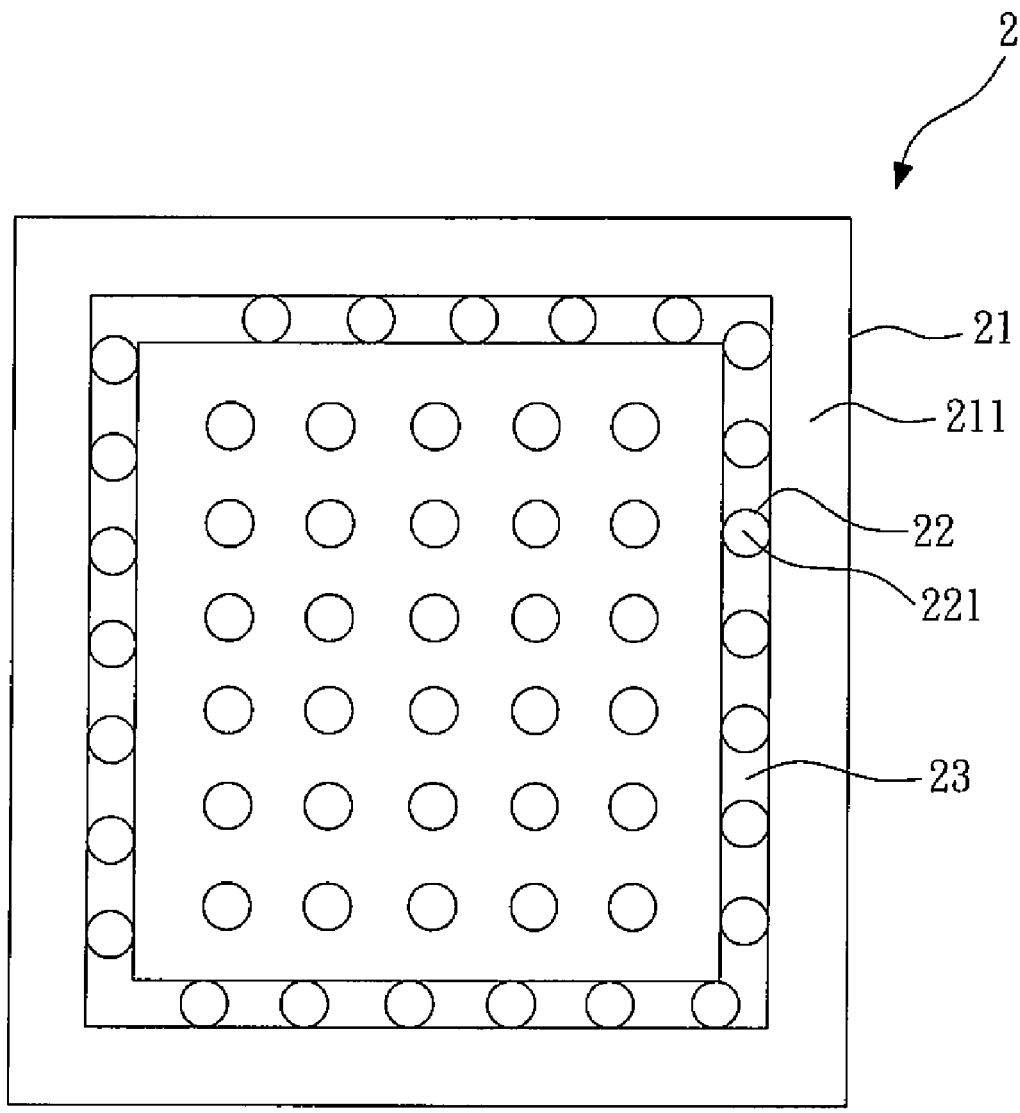
FIG. 2 is a top view of a silicon substrate having through vias according to a first embodiment of the present invention.

FIG. 2 shows a top view of a silicon substrate having through vias according to a first embodiment of the present invention. The silicon substrate 2 comprises a substrate body 21, a plurality of through vias 22 and at least one heat dissipating area 23. The substrate body 21 has a surface 211, and the material of the substrate body 21 is silicon. The through vias 22 penetrate the substrate body 21, and each of the through vias 22 has a conductive material 221 therein. In the embodiment, the through vias 22 are filled with the conductive material 221. However, in other applications, the conductive material 221 may be electroplated on the inner wall of the through vias 22.

The heat dissipating area 23 is disposed on the surface 211 of the substrate body 21 and covers at least two through vias 22. The through vias 22 inside the heat dissipating area 23 have same electrical potential. The heat dissipating area 23 is made of metal, and the material of the heat dissipating area 23 is preferably copper. In the embodiment, the heat dissipating area 23 is a closed annular area. A width of the heat dissipating area 23 is slightly greater than a diameter of the through vias 22. In the embodiment, the through vias 22 have same electrical potential; that is, all of the through vias 22 are grounded or powered.

The method for making the silicon substrate 2 is described as below. First, the substrate body 21 is provided. The substrate body 21 comprises the through vias 22. Afterward, a redistribution layer (RDL) is formed on the surface 211 of the substrate body 21, and meanwhile, the heat dissipating area 23 is formed.

Figure 3:
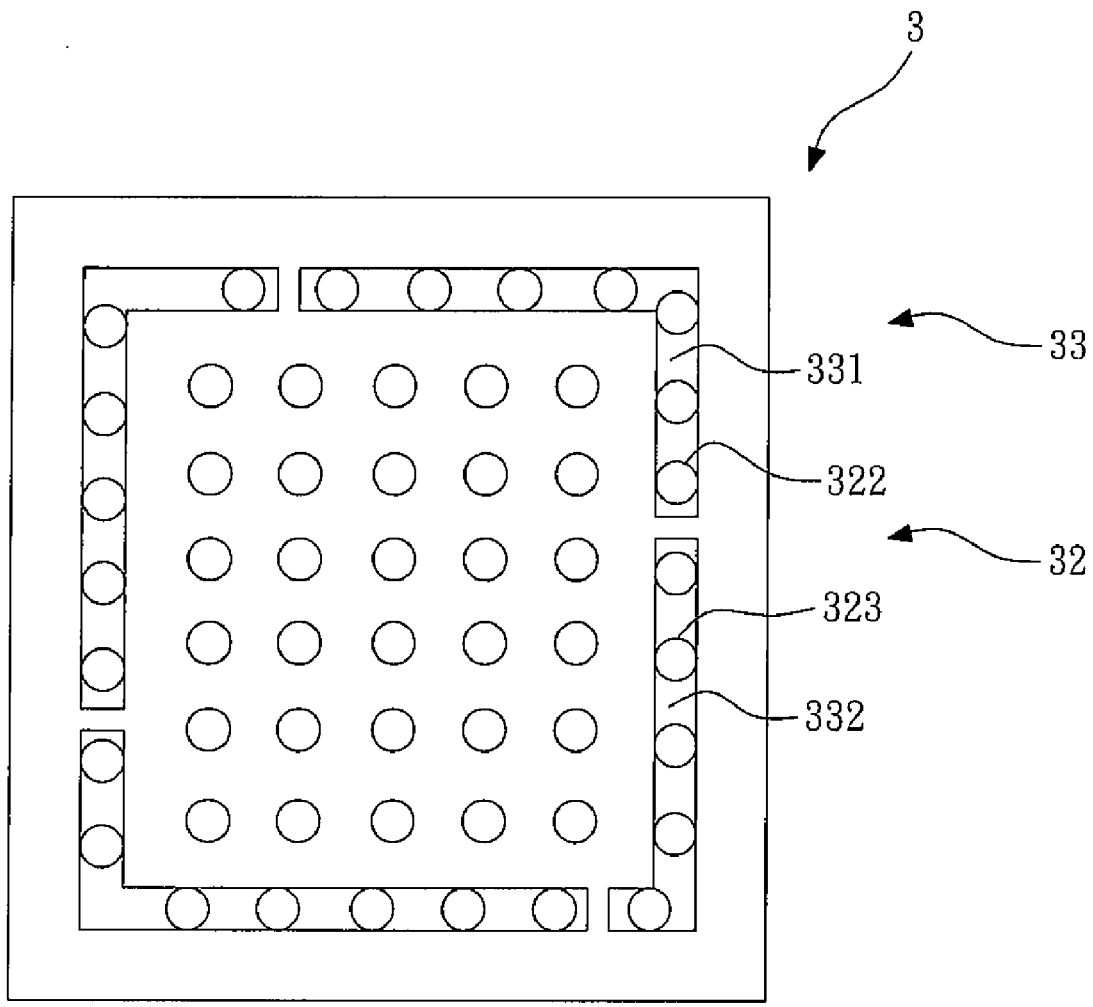
FIG. 3 is a top view of a silicon substrate having through vias according to a second embodiment of the present invention.

FIG. 3 shows a top view of a silicon substrate having through vias according to a second embodiment of the present invention. The silicon substrate 3 having through vias according to the second embodiment is substantially the same as the silicon substrate 2 (FIG. 2) according to the first embodiment, the only difference being the electrical property of the through vias 32 and the distribution of the heat dissipating area 33.

In the embodiment, the heat dissipating area 33 comprises a plurality of sections which are not connected to each other. The through vias 32 comprises a plurality of ground vias 322 and a plurality of power vias 323. The heat dissipating area 33 comprises at least one ground area 331 and at least one power area 332. The ground area 331 covers at least two ground vias 322, and the power area 332 covers at least two power vias 323.

Figure 4:
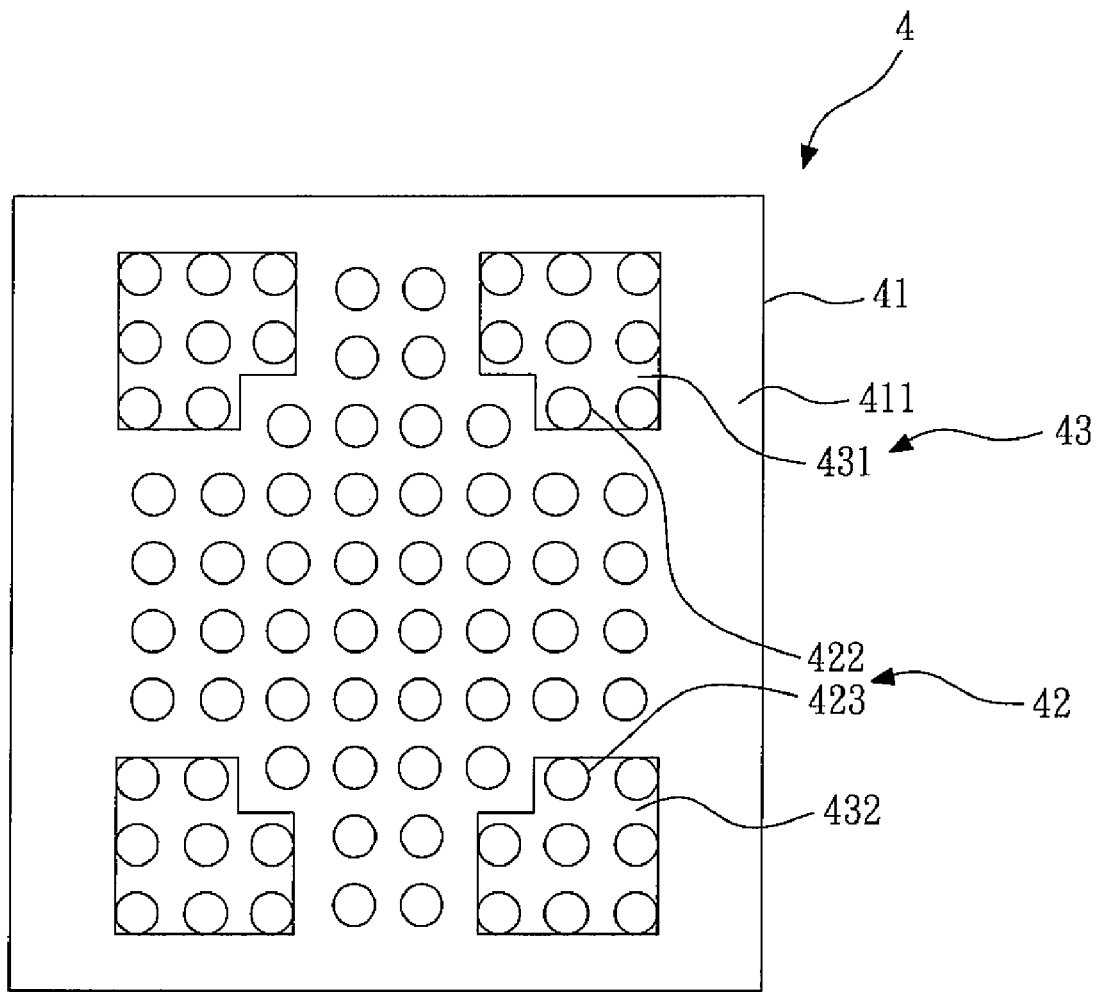
FIG. 4 is a top view of a silicon substrate having through vias according to a third embodiment of the present invention.

FIG. 4 shows a top view of a silicon substrate having through vias according to a third embodiment of the present invention. The silicon substrate 4 having through vias according to the third embodiment is substantially the same as the silicon substrate 2 (FIG. 2) according to the first embodiment, with the only difference being the electrical property of the through vias 42 and the distribution of the heat dissipating area 43.

In the embodiment, the heat dissipating area 43 comprises a plurality of sections which are not connected to each other. The sections are disposed at the periphery of the surface 411 of the substrate body 41, and cover at least four through vias 42 which are arranged in array. The through vias 42 comprises a plurality of ground vias 422 and a plurality of power vias 423. The heat dissipating area 43 comprises at least one ground area 431 and at least one power area 432. The ground area 431 covers at least two ground vias 422, and the power area 432 covers at least two power vias 423.

Figure 5:
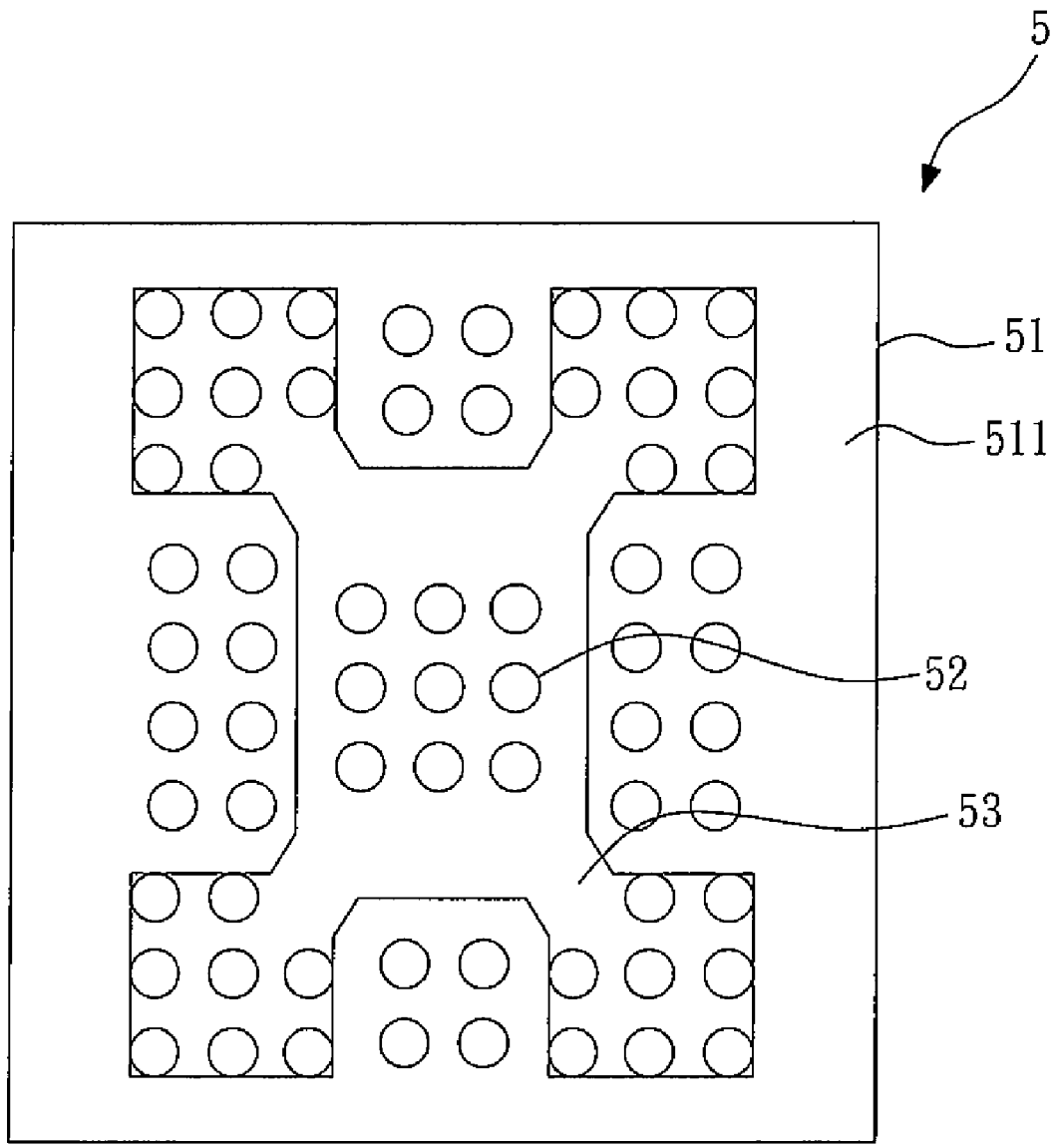
FIG. 5 is a top view of a silicon substrate having through vias according to a fourth embodiment of the present invention.

FIG. 5 shows a top view of a silicon substrate having through vias according to a fourth embodiment of the present invention. The silicon substrate 5 having through vias according to the fourth embodiment is substantially the same as the silicon substrate 2 (FIG. 2) according to the first embodiment, the only difference being that the heat dissipating area 53 is disposed at the center of the surface 511 of the substrate body 51, extends to the edge, and covers at least four through vias 52 which are arranged in array.

In the present invention, the heat in the through vias 22,32, 42,52 is transmitted to the heat dissipating areas 23,33,43,53, and since the area of the heat dissipating areas 23,33,43,53 is large, the silicon substrates 2,3,4,5 have good heat dissipation efficiency. Moreover, as the through vias inside the heat dissipating areas have same electrical potential, the noise is isolated and signal interference can be avoided.

Figure 6:
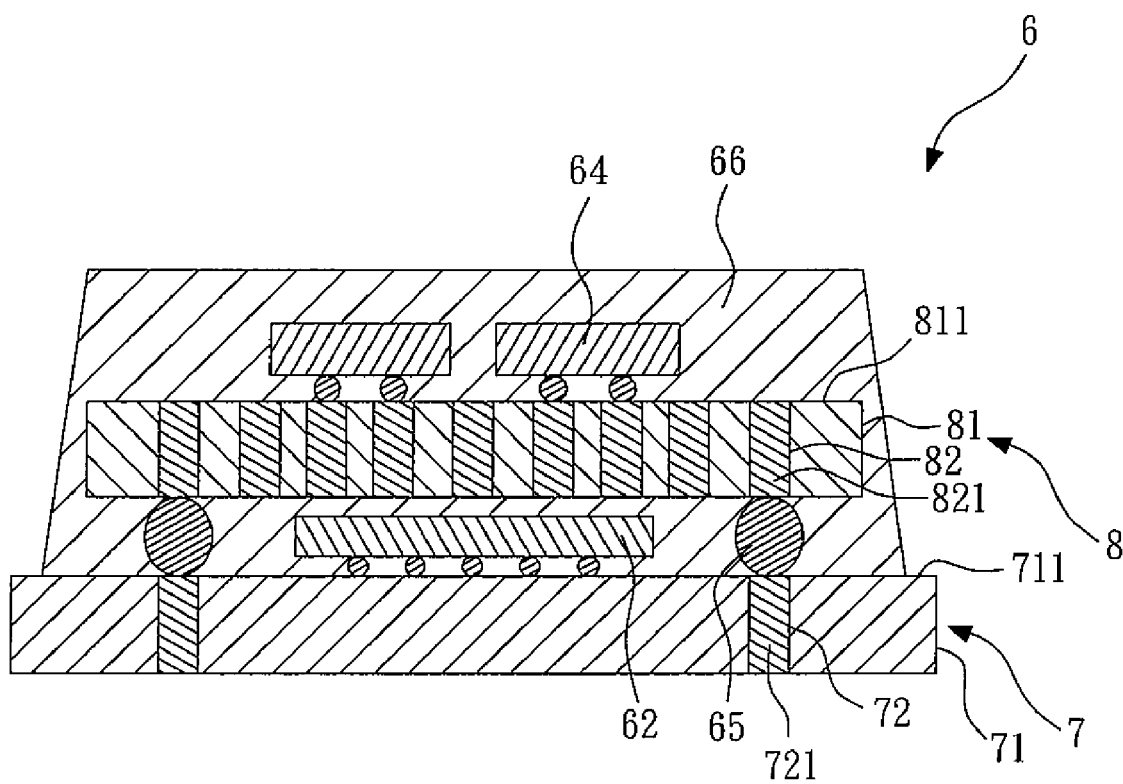
FIG. 6 is a cross-sectional view of a package having silicon substrate with through vias according to the present invention.

FIG. 6 shows a cross-sectional view of a package having silicon substrate with through vias according to the present invention. The package 6 comprises a first substrate 7, at least one first chip 62, a second substrate 8, at least one second chip 64 and a plurality of connecting elements 65. In the embodiment, the package 6 further comprises a molding compound 66.

Figure 7:
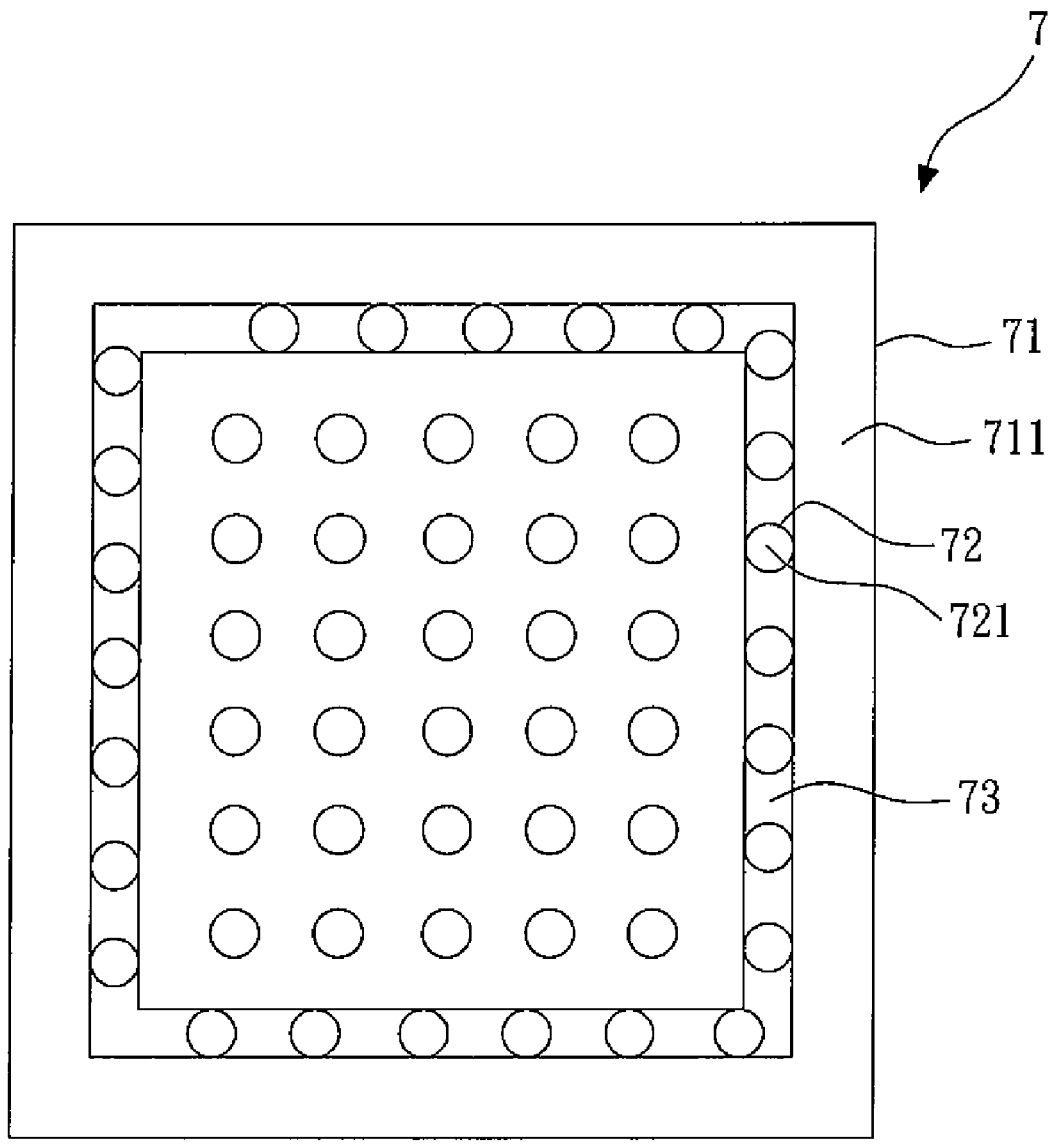
FIG. 7 is a top view of a first substrate in FIG. 6.

The first substrate 7 may be an organic substrate or a silicon substrate. The first substrate 7 may be a printed circuit board (PCB) or the silicon substrates as shown in FIG. 2 to FIG. 5, which have at least one heat dissipating area. In the embodiment, the first substrate 7 is the same as the silicon substrate 2 (FIG. 2) according to the first embodiment, as shown in FIG. 7. The first substrate 7 comprises a first substrate body 71, a plurality of first through vias 72 and at least one first heat dissipating area 73. The first substrate body 71 has a surface 711. The first through vias 72 penetrate through the first substrate body 71, and each of the first through vias 72 has a first conductive material 721 therein. The first heat dissipating area 73 is disposed on the surface 711 of the first substrate body 71 and covers at least two first through vias 72, and the first through vias 72 inside the first heat dissipating area 73 have same electrical potential. The first heat dissipating area 73 is made of metal, and the material of the first heat dissipating area 73 is preferably copper. As shown in FIG. 6, the first chip 62 is disposed on the first substrate 7 and electrically connected to the first substrate 7.

Figure 8:
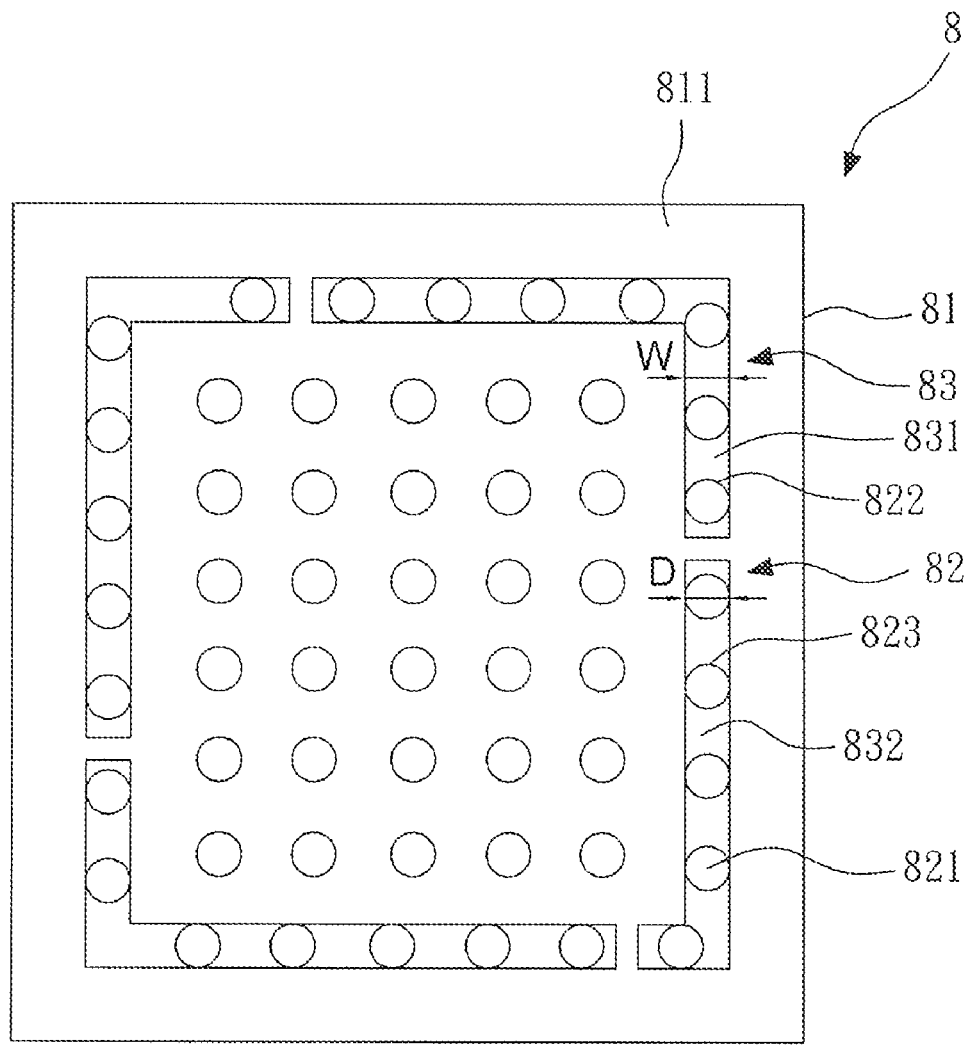
FIG. 8 is a top view of a second substrate in FIG. 6.

The second substrate 8 is disposed on the first substrate 7. FIG. 8 shows a top view of the second substrate. The second substrate 8 is a silicon substrate, and comprises a second substrate body 81, a plurality of second through vias 82 and at least one second heat dissipating area 83. The second substrate body 81 has a surface 811. The second through vias 82 penetrate the second substrate body 81, and each of the second through vias 82 has a second conductive material 821 therein.

The second heat dissipating area 83 is made of metal, and the material of the second heat dissipating area 83 is preferably copper. In the embodiment, a width W of the second heat dissipating area 83 is slightly greater than a diameter D of the second through vias 82. In the embodiment, the second heat dissipating area 83 comprises a plurality of sections (for example, a second ground area 831 and a second power area 832) which are not connected to each other.

The second through vias 82 comprises a plurality of second ground vias 822 and a plurality of second power vias 823. The second heat dissipating area 83 comprises at least one second ground area 831 and at least one second power area 832. The second ground area 831 covers at least two second ground vias 822, and the second power area 832 covers at least two second power vias 823.

In the embodiment, the second substrate 8 is the same as the silicon substrate 3 (FIG. 3) according to the second embodiment. However, it is understood that the second substrate 8 may be the silicon substrates shown in FIG. 2, FIG. 4 or FIG. 5.

As shown in FIG. 6, the second chip 64 is disposed on the second substrate 8, and electrically connected to the second substrate 8. The connecting elements 65, e.g. solder balls, electrically connect the second through vias 82 of the second substrate 8 to the first substrate 7. In the embodiment, the molding compound 66 encapsulates the first substrate 7, the first chip 62, the second substrate 8, the second chip 64 and the connecting elements 65.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A silicon substrate having through vias, comprising:
   a substrate body, having a surface, wherein the material of the substrate body is silicon;
   a plurality of through vias, penetrating the substrate body, wherein each of the through vias has a conductive material therein; and
   at least one heat dissipating area, disposed on the surface of the substrate body and covering at least two through vias, wherein the heat dissipating area is made of metal, the through vias inside the heat dissipating area have same electrical potential, and the heat dissipating area comprises a plurality of sections which are not connected to each other.

2. The silicon substrate as claimed in claim 1, wherein the through vias are filled with the conductive material.

3. The silicon substrate as claimed in claim 1, wherein the conductive material is electroplated on the inner wall of the through vias.

4. The silicon substrate as claimed in claim 1, wherein the material of the heat dissipating area is copper.

5. The silicon substrate as claimed in claim 1, wherein a width of the heat dissipating area is slightly greater than a diameter of the through vias.

6. The silicon substrate as claimed in claim 1, wherein the heat dissipating area covers at least four through vias which are arranged in array.

7. The silicon substrate as claimed in claim 1, wherein the through vias comprise a plurality of ground vias and a plurality of power vias, the heat dissipating area comprises at least one ground area and at least one power area, the ground area covers at least two ground vias, and the power area covers at least two power vias.

8. A package having silicon substrate with through vias, comprising:
- a first substrate;
- a second substrate, disposed on the first substrate, wherein the second substrate is a silicon substrate, and the second substrate comprises:
  - a second substrate body, having a surface;
  - a plurality of second through vias, penetrating the second substrate body, wherein each of the second through vias has a second conductive material therein; and
  - at least one second heat dissipating area, disposed on the surface of the second substrate body and covering at least two second through vias, wherein the second heat dissipating area is made of metal, the second through vias inside the second heat dissipating area have same electrical potential, and the second heat dissipating area is a closed annular area;
- at least one second chip, disposed on the second substrate and electrically connected to the second substrate; and
- a plurality of connecting elements, electrically connecting the second through vias of the second substrate to the first substrate.

9. The package as claimed in claim 8, wherein the package further comprises a molding compound, encapsulating the first substrate, the first chip, the second substrate, the second chip and the connecting elements.

10. The package as claimed in claim 8, wherein the first substrate comprises:
- a first substrate body, having a surface;
- a plurality of first through vias, penetrating the first substrate body, wherein each of the first through vias has a first conductive material therein; and
- at least one first heat dissipating area, disposed on the surface of the first substrate body and covering at least two first through vias, wherein the first heat dissipating area is made of metal, and the first through vias inside the first heat dissipating area have same electrical potential.

11. The package as claimed in claim 8, wherein the first substrate is a silicon substrate or an organic substrate.

12. The package as claimed in claim 8, wherein the second through vias are filled with the second conductive material.

13. The package as claimed in claim 8, wherein the second conductive material is electroplated on the inner wall of the second through vias.

14. The package as claimed in claim 8, wherein a width of the second heat dissipating area is slightly greater than a diameter of the second through vias.

15. The package as claimed in claim 8, wherein the second heat dissipating area comprises a plurality of sections which are not connected to each other.

16. The package as claimed in claim 8, wherein the second through vias comprise a plurality of second ground vias and a plurality of second power vias, the second heat dissipating area comprises at least one second ground area and at least one second power area, the second ground area covers at least two second ground vias, and the second power area covers at least two second power vias.

17. The package as claimed in claim 8, further comprising at least one first chip, disposed on the first substrate and electrically connected to the first substrate.

18. A silicon substrate having through vias, comprising:
- a substrate body, having a surface, wherein the material of the substrate body is silicon;
- a plurality of through vias, penetrating the substrate body, wherein each of the through vias has a conductive material therein; and
- at least one heat dissipating area, disposed on the surface of the substrate body and covering at least two through vias, wherein the heat dissipating area is made of metal, the through vias inside the heat dissipating area have same electrical potential, and the heat dissipating area is a closed annular area.

* * * * *